(12) United States Patent
Chang et al.

(10) Patent No.: US 11,409,152 B2
(45) Date of Patent: Aug. 9, 2022

(54) ANTI-PEEPING MODULE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Kangle Chang, Beijing (CN); Pengfei Cheng, Beijing (CN); Heling Zhu, Beijing (CN); Lu Yu, Beijing (CN); Jian Sang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 160 days.

(21) Appl. No.: 16/910,601

(22) Filed: Jun. 24, 2020

(65) Prior Publication Data
US 2021/0033899 A1 Feb. 4, 2021

(30) Foreign Application Priority Data

Jul. 31, 2019 (CN) .......................... 201921234176.8

(51) Int. Cl.
*G02F 1/1335* (2006.01)
*H01L 27/32* (2006.01)
*F21V 8/00* (2006.01)

(52) U.S. Cl.
CPC ......... *G02F 1/1335* (2013.01); *G02B 6/0055* (2013.01); *H01L 27/3232* (2013.01)

(58) Field of Classification Search
None
See application file for complete search history.

(56) References Cited

U.S. PATENT DOCUMENTS

2021/0405266 A1\* 12/2021 Chen ...................... G02B 5/005

\* cited by examiner

*Primary Examiner* — Richard H Kim
(74) *Attorney, Agent, or Firm* — Calfee, Halter & Griswold LLP

(57) ABSTRACT

An anti-peeping module provided by an embodiment of the application includes a plurality of light transmitting films, each including at least two light transmitting sub-films having different refractive indexes which are disposed in a laminated manner, and a first optical path modulating layer on one side of the plurality of light transmitting films, the first optical path modulating layer comprising a plurality of zigzag structures, the and being configured to allow light entering into the plurality of light transmitting films at a Brewster incident angle to exit from the anti-peeping module in a travelling direction perpendicular to a plane where the anti-peeping module is located.

19 Claims, 8 Drawing Sheets

ANTI-PEEPING MODULE AND DISPLAY DEVICE

CROSS-REFERENCE TO RELATED APPLICATIONS

This application is based upon and claims priority to Chinese Patent Application No. 201921234176.8, filed Jul. 31, 2019, the entire contents of which are incorporated herein by reference.

TECHNICAL FIELD

The present application relates to the field of display technology, and more particularly, to an anti-peeping module and a display device.

BACKGROUND

Nowadays, the society has increasingly more needs on display products, as well as increasingly higher requirements. Users have increased awareness of privacy protection, are paying more attention on viewing privacy of the display products, and thus have increasingly wide requirements for anti-peeping. For example, for display products such as cell phones and tablet computers, anti-peeping is necessary to achieve the objection of protecting personal privacy and business secrets. The existing most mature anti-peeping solution is the anti-peeping film technology, of which the principle lies in a micro-size shutter shaped light-shielding structure inside a film material. Such a structure allows light to exit only within a certain angle, and shields most of the light exiting at a large angle, and thus realizing an anti-peeping function.

However, such an anti-peeping method using an anti-peeping film (or referred to as a privacy film) is based on geometric optics and uses a blinding method such that a single direction anti-peeping effect is realized only in a horizontal direction, that is, only anti-peeping in the horizontal direction can be achieved, and anti-peeping in a vertical direction cannot be achieved at the same time.

SUMMARY

An embodiment of the present application provides an anti-peeping module, including a plurality of light transmitting films and a first optical path modulating layer on one side of the plurality of light transmitting films, wherein each of the plurality of light transmitting films includes at least two light transmitting sub-films having different refractive indexes which are disposed in a laminated manner; the first optical path modulating layer includes a plurality of zigzag structures, and the first optical path modulating layer is disposed such that light entering into the plurality of light transmitting films at a Brewster incident angle to exit from the anti-peeping module in a travelling direction perpendicular to a plane where the anti-peeping module is located.

Optionally, the plurality of light transmitting films have a light incident surface and a light exit surface both being planes, the first optical path modulating layer has a zigzag surface and a plane opposite to the zigzag surface and adjacent to the plurality of light transmitting films, and the first optical path modulating layer is located at the side of the light exit surfaces of the plurality of light transmitting films.

Optionally, the anti-peeping module further includes a second optical path modulating layer at the side of the light incident surfaces of the plurality of light transmitting films, the second optical path modulating layer including a plurality of zigzag structures, and the second optical path modulating layer has a zigzag surface and a plane opposite to the zigzag surface and adjacent to the plurality of light transmitting films.

Optionally, the plurality of light transmitting films have a light incident surface and a light exit surface both being zigzag surfaces, the first optical modulating layer has a zigzag surface and a plane opposite to the zigzag surface and adjacent to the zigzag surfaces of the plurality of light transmitting films, and the first optical modulating layer is located at the side of the light exit surfaces of the plurality of light transmitting films.

Optionally, the anti-peeping module further includes a second optical path modulating layer at the side of the light exit surfaces of the plurality of light transmitting films, the second optical path modulating layer having a light incident surface and a light exit surface both being zigzag surfaces, and having a refractive index less that of respective one of the light transmitting sub-films adjacent thereto.

Optionally, any adjacent light transmitting sub-films in the plurality of light transmitting film include interfaces having Brewster angle equal to one another.

Optionally, respective light transmitting sub-films in different ones of the plurality of light transmitting films include the same materials.

Optionally, the light transmitting sub-films including the same materials in any one of the light transmitting films have the same thickness, and respective light transmitting sub-films including the same materials in different ones of the light transmitting films have different thicknesses.

Another embodiment of the present application provides a display device, including a liquid crystal display panel, a backlight module, and the anti-peeping module provided by the embodiment of the present disclosure, which is located between the liquid crystal display panel and the backlight module, or is located on one side of the liquid crystal display panel facing away from the backlight module.

Optionally, the backlight module includes a light guide plate, a light source on a side surface of the light guide plate, and a reflective sheet on one side of the light guide plate away from the liquid crystal display panel, and wherein the light guide plate has a dot structure which makes light exit angle of the light guide plate to be the highest light output at the Brewster angle, on one side thereof facing away from the reflective sheet; or the backlight module includes bat wing light sources and an optical film located above the bat wing light sources, and each of the bat wing light sources include bat wings having an angle to make a light exit angle of light to be the strongest light intensity at Brewster angle.

Another embodiment of the present application provides a display device, including an electroluminescence display panel, and the anti-peeping module provided by the embodiment of the present application, which is provided on a light exiting side of the electroluminescence display panel.

BRIEF DESCRIPTION OF THE DRAWINGS

In order to explain technical solutions of embodiments of the present disclosure more clearly, the drawings used in describing embodiments are introduced below in brief. Obviously, the drawings in the following description are just some embodiments of the present disclosure. For those of ordinary skill in the art, other drawings may be obtained based on these drawings without creative efforts.

DETAILED DESCRIPTION

Figure 1:
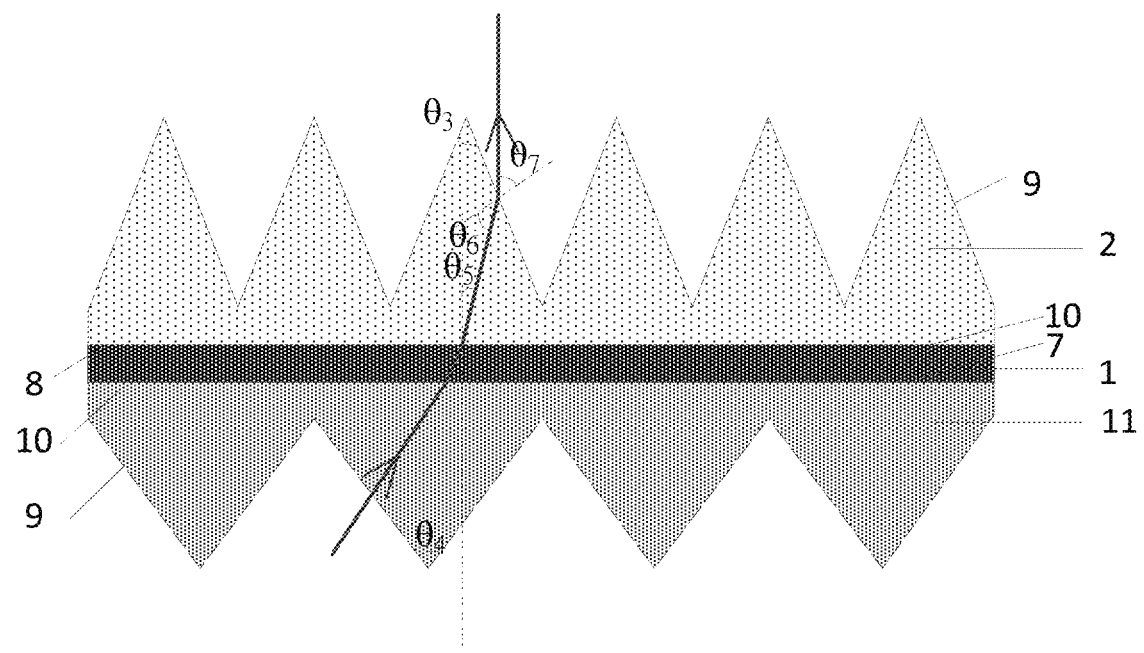
FIG. 1 is a schematic structural view illustrating an anti-peeping module provided by an embodiment of the present application.
Figure 2:
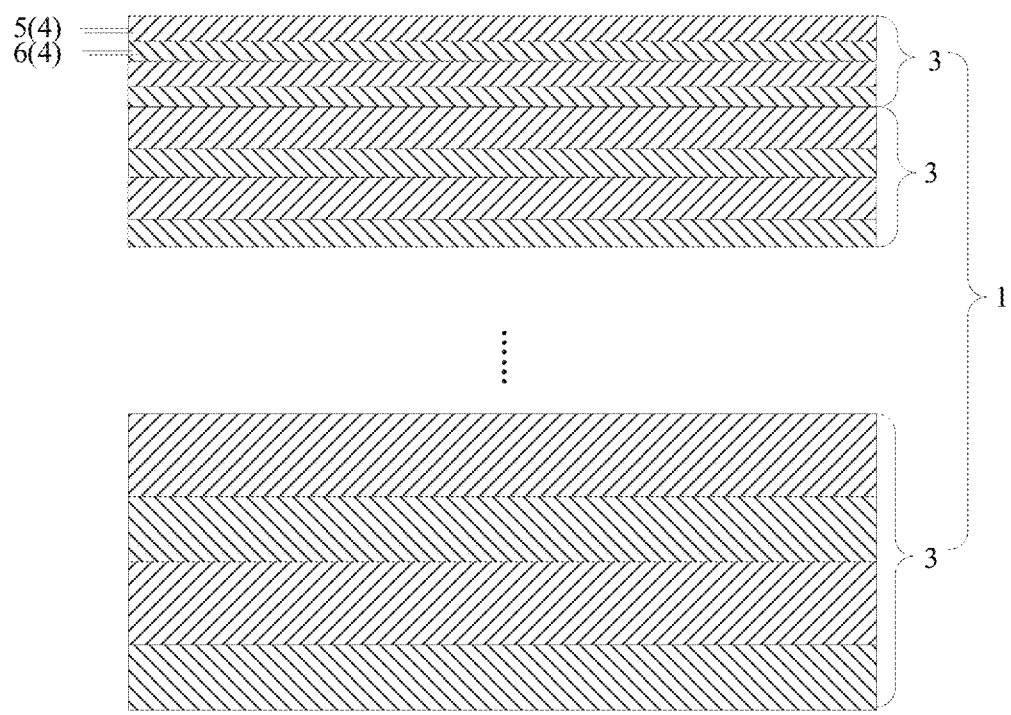
FIG. 2 is a schematic structural view illustrating a plurality of light transmitting films in an anti-peeping module provided by an embodiment of the present application.

An embodiment of the present disclosure provides an anti-peeping module, as shown in FIG. 1, which includes a plurality of light transmitting films 1 and a first optical path modulating layer 2 at one side of the plurality of light transmitting films. As shown in FIG. 2, each of the light transmitting films 3 includes at least two light transmitting sub-films 4 having different refractive indexes which are disposed in stack. The first optical path modulating layer 2 includes a plurality of zigzag structures, and is disposed such that light enters into the plurality of light transmitting films 1 at a Brewster incident angle, and finally exits from the anti-peeping module after passing through the plurality of light transmitting films 1 in a travelling direction perpendicular to a plane where the anti-peeping module is located.

Next, the principle of the anti-peeping module provided by the embodiment of the present application is explained.

Figure 3:
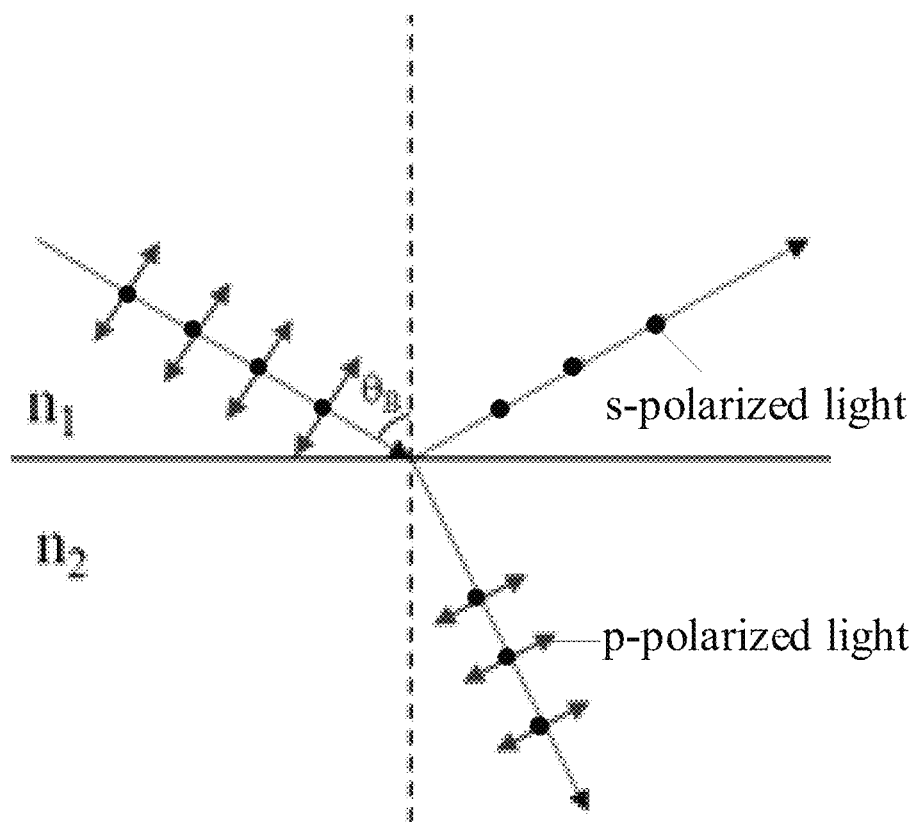
FIG. 3 is a schematic diagram illustrating a principle of Brewster angle.

Amplitudes and phase relationships of reflection, refraction and incident light waves are related to a vibration direction of the incident light wave. As shown in FIG. 3, an electric vector of light is decomposed into s-polarized light perpendicular to an incident surface and p-polarized light parallel to the incident surface. The p-polarized light has a reflectivity $R_p$ at an interface, where $$R_p = \frac{\tan^2(\theta_1 - \theta_2)}{\tan^2(\theta_1 + \theta_2)},$$

in which $\theta_1$ is an incident angle in an $n_1$ medium, and $\theta_2$ is an exit angle in an $n_2$ medium. When the reflectivity of the p-polarized light is zero (0), that is, when $R_p=0$, the incident angle herein is Brewster angle $\theta_B$, that is, $$\theta_B + \theta_2 = \frac{\pi}{2},$$

and in combination with the law of reflection $\theta_B \sin n_1 = \theta_2 \sin n_2$, it can be obtained that $$\theta_B = \arctan\left(\frac{n_2}{n_1}\right).$$

Rp is 0, indicating that when the incident angle is $\theta_B$, the p-polarized light is all transmitted without being reflected. When Rp is equal to 0, the s-polarized light is both transmitted and reflected.

The anti-peeping module provided by the embodiment of the present application includes the plurality of light transmitting films, each including at least two light transmitting sub-films with different refractive indexes which are laminatedly disposed. That is, the light transmitting sub-films with different refractive indexes are alternately and periodically stacked together, and the plurality of light transmitting films are equivalent to a distributed Bragg reflective film. Based on the principle of the distributed Bragg reflective film, when light passes through different light transmitting sub-films in the anti-peeping module provided by the embodiment of the present application, it may be reflected at interfaces between different light transmitting sub-films. Light reflected by each of the light transmitting sub-films constructively interferes with one another due to changes of phase angles, and then combines with one another to obtain strong reflection light. Therefore, the plurality of light transmitting films may be provided such that s-polarized light is totally reflected, and p-polarized light can be totally transmitted when it has an incident angle of Brewster angle $\theta_B$ in the light transmitting film. Moreover, when light is incident at an incident angle smaller or greater than the Brewster angle in the light transmitting films, there is also an angle range that causes the s-polarized light to be totally reflected and the p-polarized light has a transmittance not equal to 0 (zero). As a result, the plurality of light transmitting films can achieve selections on light angles, such that the anti-peeping module including the plurality of light transmitting films has a certain angle of view, and can also achieve a selection on polarization state.

The anti-peeping module provided by the embodiment of the present application further includes the first optical path modulating layer including the zigzag structure, such that light enters into the light transmitting films at a Brewster angle, and finally exits from the anti-peeping module after passing through the light transmitting films in a travelling direction perpendicular to a plane where the anti-peeping module is located.

According to the anti-peeping module provided by the embodiment of the present disclosure, when the incident angle of light in the plurality of light transmitting films is within an angle range including the Brewster angle, the s-polarized light can be totally reflected, so that only the p-polarized light is transmitted, and thus the anti-peeping module provided by the embodiment of the present disclosure can select incident angles within the angle range including the Brewster angle so as to achieve anti-peeping, and meanwhile, the anti-peeping module provided by the embodiment of the present disclosure can achieve 360-degree anti-peeping by selecting angles of light in various directions. Because of the disposing of the first optical path modulating layer, a light exit angle of the anti-peeping module can be adjusted such that the light finally exiting from the anti-peeping module travels in a direction perpendicular to a plane where the anti-peeping module is located, which is convenient for a user to use a display product disposed with the anti-peep module from the front.

Optionally, in the plurality of light transmitting films of the anti-peeping module provided by the embodiment of the present application, any adjacent ones of the light transmitting sub-films have a Brewster angle of incident light at an interface therebetween equal to one another.

Thus, after light incident at the Brewster angle between respective light transmitting sub-films of the plurality of light transmitting films passes through the plurality of light transmitting films, the s-polarized light can be totally reflected and only the p-polarized light can be transmitted.

In the plurality of light transmitting films shown in FIG. 2 provided by the embodiment of the present application, each of the light transmitting films only includes first light transmitting sub-films 5 and second light transmitting sub-films 6 which are alternately stacked. In specific implementation, each of the light transmitting films may also include three or more light transmitting sub-films with different refractive indexes, and no matter how many light transmitting sub-films are included in each of the plurality of light transmitting films, it needs to satisfy that the Brewster angles at the interfaces between any adjacent light transmitting sub-films are equal to one another.

Optionally, in different light transmitting films, respective light transmitting sub-films may be made from the same combination of material. For example, the first light transmitting film may include two light transmitting sub-films made from material A and material B, respectively, while the remaining light transmitting films may also include two light transmitting sub-films made from material A and material B.

As shown in FIG. 2, each of the light transmitting films includes first light transmitting sub-films 5 and second light transmitting sub-films 6 alternately stacked. It is also possible in different embodiments that different light transmitting films can include different light transmitting sub-films, and still to satisfy that the Brewster angles at the interfaces between any adjacent ones of the light transmitting sub-films are equal to one other.

Optionally, light transmitting sub-films including the same materials in any one of the light transmitting films have the same thickness, and respective light transmitting sub-films including the same materials in different ones of the light transmitting films have different thicknesses.

As shown in FIG. 2, in any light transmitting film 3, respective first light transmitting sub-films 5 thereof have the same thickness, and respective second light transmitting sub-films 6 thereof have the same thickness, and in different light transmitting films 3, respective first light transmitting sub-films 5 thereof have different thicknesses, and respective second light transmitting sub-films 6 thereof also have different thicknesses.

It should be noted that in the distributed Bragg reflective film formed by the plurality of light transmitting films, the number of layers of the light transmitting sub-films can be selected based on the actually needed reflectivity, according to the distributed Bragg reflective film (DBR) calculation formula, which is as follows:

$$R_{DBR} = \left( \frac{n_2^N - n_1^N}{n_2^N + n_1^N} \right)^2,$$

where N is the number of layers of the light transmitting sub-films in one light transmitting film 3. In order to realize the reflection of s-polarized light in the entire visible light band (400 nm to 700 nm), each of the light transmitting films corresponds to a different center wavelength of reflection. In each of the light transmitting films, respective light transmitting sub-films thereof have a thickness of $n\lambda/4$, where n is the refractive index of the light transmitting sub-films, and $\lambda$ is the center wavelength of reflection. That is to say, in a specific embodiment, in each of the light transmitting films, the thickness of the light transmitting sub-films needs to be selected according to the refractive index of the light transmitting sub-films and the center wavelength of reflection.

Optionally, a material of the first light transmitting sub-films is polymethyl methacrylate (PMMA), and a material of the second light transmitting sub-films is polyethylene terephthalate (PET).

Optionally, in the anti-peeping module shown in FIG. 1 provided by the embodiment of the present disclosure, the plurality of light transmitting films has a light incident surface 7 and a light exit surface 8, of which both are planes, and the first optical path modulating layer 2 has a zigzag surface 9 and a plane 10 opposite to the zigzag surface. The plurality of light transmitting films are adjacent to the plane of the first optical path modulating layer, and the first optical path modulating layer is located at the side of the light exit surfaces of the plurality of light transmitting films.

In the anti-peeping module provided by the embodiment of the present application, since both the light incident surfaces and the light exit surfaces of the plurality of light transmitting films are planes, light has an incident angle being the Brewster angle $\theta_B$ between respective light transmitting sub-films in the plurality of light transmitting films after entering into the plurality of light transmitting films, and exits from the plurality of light transmitting films in a plane not perpendicular to the light exit surface. The zigzag structure can be selected to have an appropriate angle such that when the incident angle is the Brewster angle $\theta_B$, light emitted from the zigzag surface of the zigzag structure propagates in a direction perpendicular to the plane where the anti-peeping module is located. In addition, the first optical path modulating layer including the zigzag structure is located on one side of the light exit surface of the plurality of light transmitting films, which can also avoid total reflection occurring on the light exit surface of the light transmitting film.

It should be noted that specific values of the Brewster angles are related to the refractive indexes of respective light transmitting sub-films in the anti-peeping module. Accordingly, the zigzag structure of the first optical path modulating layer can have an angle designed according to the law of refraction in combination with the Brewster angles of the plurality of light transmitting films, so that light having an incident angle of the Brewster angle among respective light transmitting sub-films in the plurality of light transmitting films after entering into the plurality of light transmitting films can finally exit from the anti-peeping module in a travelling direction perpendicular to a plane where the anti-peeping module is located.

Optionally, the first optical path modulating layer has a same refractive index as that of a light transmitting sub-film adjacent thereto.

Optionally, the anti-peeping module as shown in FIG. 1 provided by the embodiment of the present disclosure may further include a second optical path modulating layer 11 at the side of the light incident surface of the plurality of light transmitting films, the second optical path modulating layer includes a plurality of zigzag structures, and the second optical path modulating layer has a zigzag surface 9 and a plane 10 opposite to the zigzag surface. The plurality of light transmitting films 1 are adjacent to the plane 10 of the second optical path modulating layer.

The second optical path modulating layer may prevent total reflection from occurring in the case where only the plurality of light transmitting films are provided. In addition, the second optical path modulating layer may cooperate with a light source so that the light at the Brewster angle within incident angles has the strongest light intensity.

Optionally, in the anti-peeping module shown in FIG. 1 provided by the embodiment of the present application, the zigzag structures in the first and second optical path modulating layers have high-refractive-index prism microstructures.

Of course, the first optical path modulating layer can also be disposed in other ways. For example, the first optical path modulating layer can be disposed on the side of the light incident surface of the plurality of light transmitting films.

Figure 4:
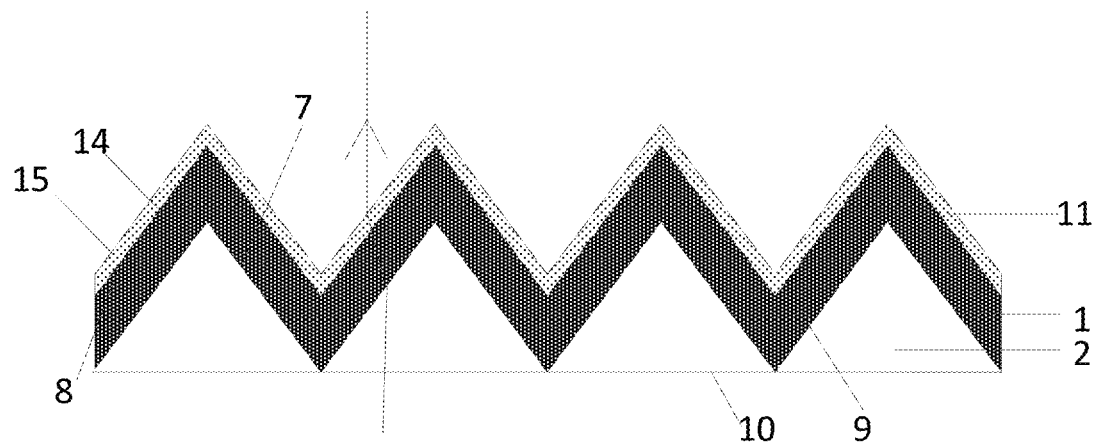
FIG. 4 is a schematic structural view illustrating another anti-peeping module provided by an embodiment of the present application.

Optionally, as shown in FIG. 4, the plurality of light transmitting films 1 has a light incident surface 7 and a light exit surface 8, of which both are zigzag surfaces, and a first optical path modulating layer 2 having a zigzag surface 9 and a plane 10 opposite to the zigzag surface 9. The plurality of light transmitting films 1 are adjacent to the zigzag surface 9 of the first optical path modulating layer 2, and the first optical path modulating layer 2 is located on the side of the light incident surfaces 7 of the plurality of light transmitting films 1.

Optionally, the anti-peeping module shown in FIG. 4 provided by the embodiment of the present application may further include a second optical path modulating layer 11 located on the side of the light exit surfaces 8 of the light transmitting films. The second optical path modulating 11 has a light incident surface 14 and a light exit surface 15, of which both are zigzag surfaces. The second optical path modulating layer 11 has a refractive index less than that of respective ones of the light transmitting sub-films adjacent thereto.

In the anti-peeping module provided by the embodiment of the present application, when the light incident and exit surfaces of the plurality of light transmitting films both have a zigzag shape, the second optical path modulating layer is provided at the light exiting surfaces of the plurality of light transmitting films, and has a refractive index less than that of the respective ones of the light transmitting sub-films adjacent thereto, so that total reflection can be avoided on the light exit surfaces of the plurality of light transmitting films.

Figure 5:
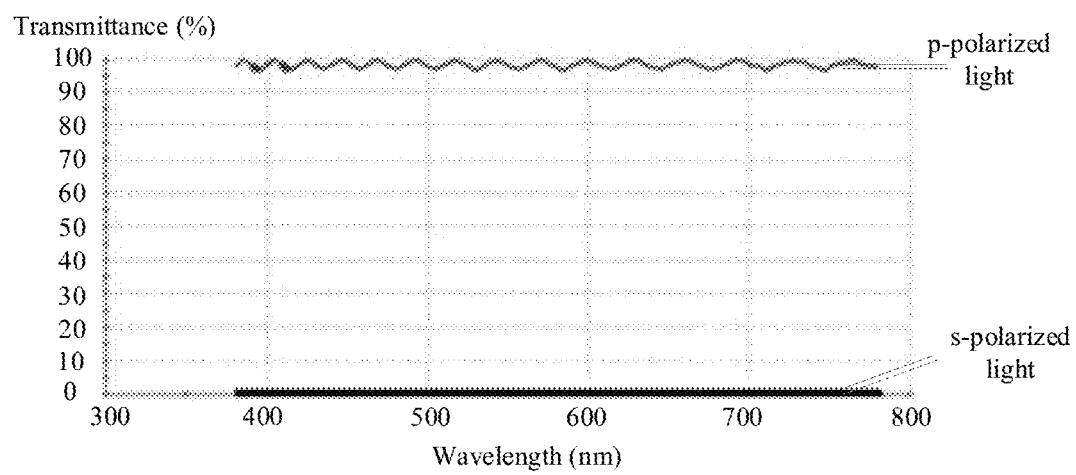
FIG. 5 is a schematic diagram illustrating a simulation result of transmittances of s-polarized light and p-polarized light at an incident angle of Brewster angle $\theta_B$ according to a plurality of light transmitting films provided by an embodiment of the present application.
Figure 6:
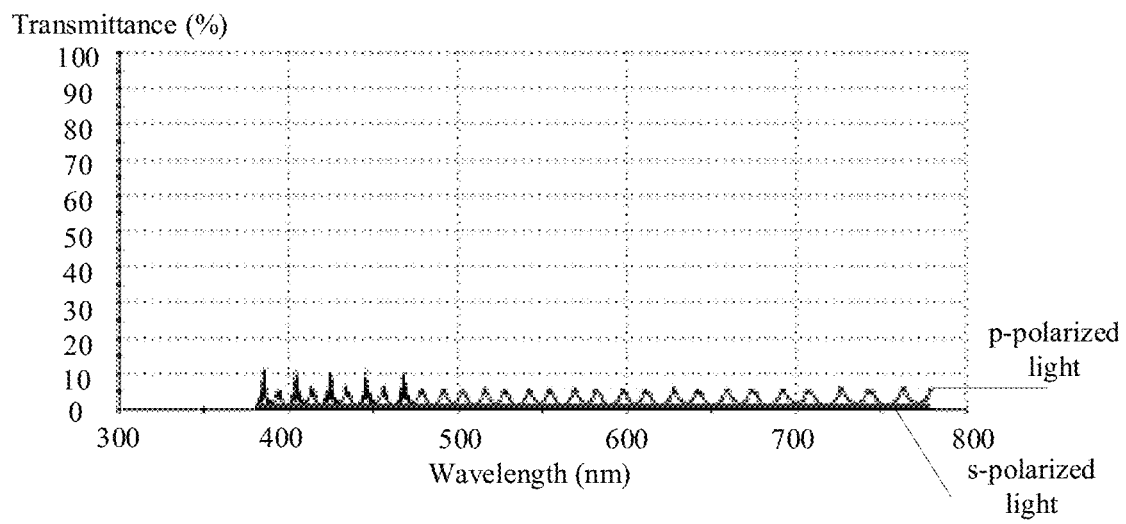
FIG. 6 is a schematic diagram illustrating a simulation result of transmittances of s-polarized light and p-polarized light at an incident angle of 42° according to a plurality of light transmitting films provided by an embodiment of the present application.
Figure 7:
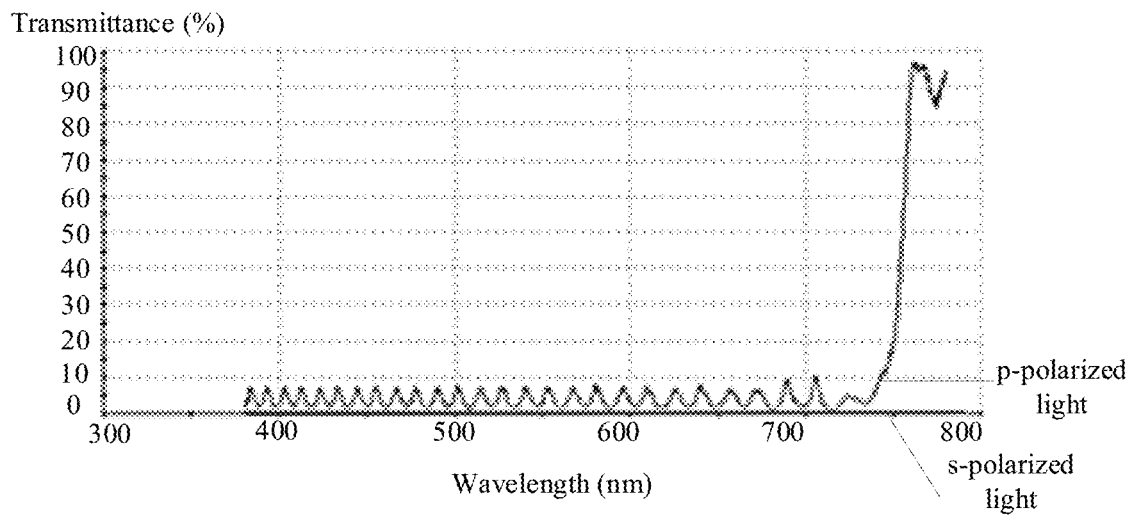
FIG. 7 is a schematic diagram illustrating a simulation result of transmittances of s-polarized light and p-polarized light at an incident angle of 56° according to a plurality of light transmitting films provided by an embodiment of the present application.
Figure 8:
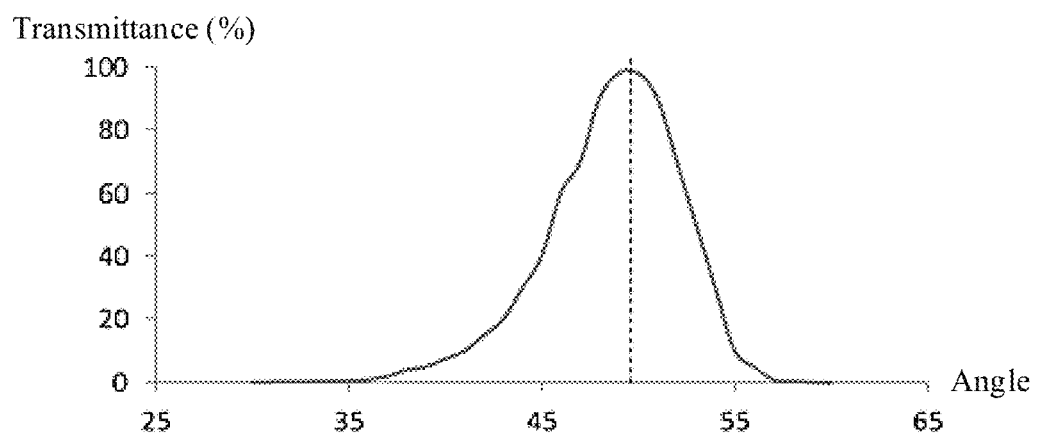
FIG. 8 is a schematic diagram illustrating a simulation result of transmittances of p-polarized light according to a plurality of light transmitting films provided by an embodiment of the present application.
Figure 9:
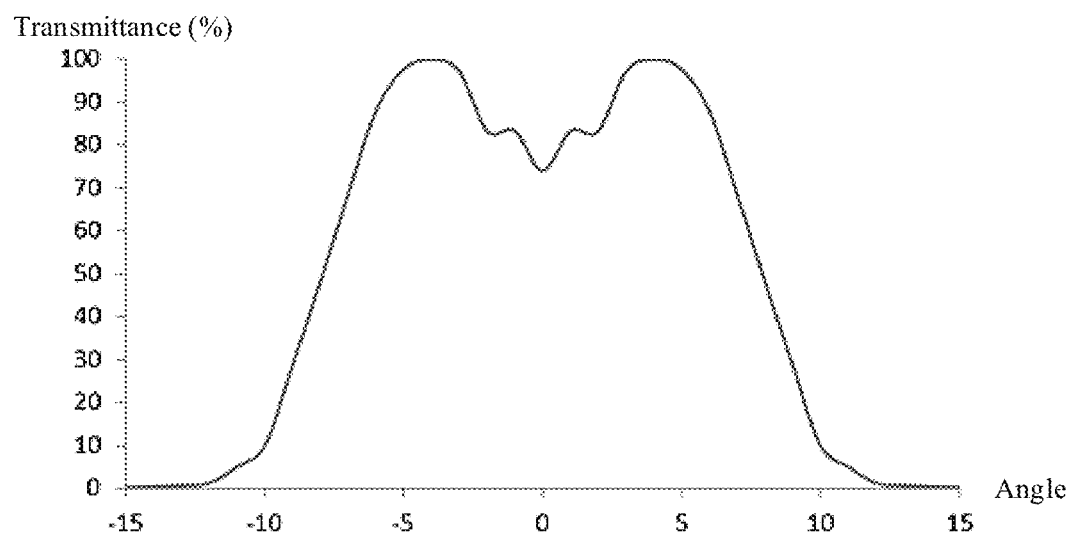
FIG. 9 is a schematic diagram illustrating a simulation result of transmittances of p-polarized light according to an anti-peeping module provided by an embodiment of the present application.

Next, taking each light transmitting film including two light transmitting sub-films with different refractive indexes as an example, a distributed Bragg reflection film formed by the plurality of light transmitting films will be exemplified. For example, ten light transmitting films including first light transmitting sub-films formed of PMMA and second light transmitting sub-films formed of PET can be formed, and PMMA and PET are alternately stacked to form 138 layers of light transmitting sub-films in each of the light transmitting films. A first light transmitting film among the ten light transmitting films corresponds to a wavelength range having a center wavelength of reflection being 395 nm and having an interval of 51 nm, and second to tenth light transmitting films among the ten light transmitting films correspond to wavelength ranges having respective reflection center wavelengths of 446 nm, 497 nm, 548 nm, 599 nm, 650 nm, 701 nm, 752 nm, 803 nm, and 854 nm. According to the principle of the distributed Bragg reflection film (DBR), in each of the light transmitting films, PMMA has a thickness of $n_1\lambda/4$, PET has a thickness of $n_2\lambda/4$, where $\lambda$ is a center wavelength of reflection, and PMMA has a refractive index $n_1$ of 1.49, and PET has a refractive index $n_2$ of 1.75. A total thickness of the ten light transmitting films is 153 μm. The distributed Bragg reflective film formed by the ten light transmitting films described as above is simulated by using an optical thin film analysis and design software (essential macleod). Through calculation, it can be known that the Brewster angle $\theta_B$ is 49°. FIG. 5 shows light transmittances of s-polarized light and p-polarized light when an incident angle is $\theta_B$, and it can be seen that the p light has a transmittance nearly 100% and the s light has a transmittance of 0. FIG. 6 shows light transmittances of s-polarized light and p-polarized light when an incident angle is 42°, and FIG. 7 shows light transmittances of s-polarized light and p-polarized light when an incident angle is 56°. The transmittances of the s light always are zero (0) at different incident angles, and the transmittances of the p light are different at different incident angles, which is shown in the graph of FIG. 8. Taking 1 nit as the brightness standard, the ten anti-peeping modules have anti-peeping viewing angles between 30° and 60°. Taking the anti-peeping module as shown in FIG. 4 as an example, an incident angle between two adjacent light transmitting sub-films in the light transmitting films is the Brewster angle $\theta_B$, and the anti-peeping module provided with the first and second optical path modulating layers has a transmittance shown in FIG. 9, in which the p-polarized light is superimposed to be symmetric about 0°, and thus p-polarized light within ±15° can be emitted through the anti-peeping module.

Taking the anti-peeping module including the above-mentioned ten light transmitting films as an example, as well as the Brewster angle $\theta_B$ being 49°, in the anti-peeping module shown in FIG. 1 provided by the embodiment of the present disclosure, for example, the first optical path modulation layer can contact PET, and thus can be made of a material with a refractive index of 1.75. Specifically, the zigzag structure of the first optical path modulation layer has an apex angle $\theta_3$ of 30°, and a refractive angle $\theta_5$ between the plurality of light transmitting films and the first optical path modulating layer 2 is 40°, an incident angle $\theta_6$ between the first optical path modulating layer 2 and air is 33.5°, and a refractive angle $\theta_7$ between the first optical path modulation layer 2 and air Is 75°, so that light exiting from the first optical path modulating layer 2 travels in a direction perpendicular to the light exit surfaces of the light transmitting films 1, that is, the light finally emitting from the anti-peeping module travels in a direction perpendicular to the plane where the anti-peeping module is located. The maximum height of the first optical path modulation layer may be, for example, 25 μm, and the zigzag structure in the second optical path modulation layer has an apex angle $\theta_4$ of, for example, 98°.

Based on the same inventive concept, an embodiment of the present application also provides a display device including a liquid crystal display panel, a backlight module, and the above-mentioned anti-peeping module provided by the embodiment of the present application located between the liquid crystal display panel and the backlight module or located on one side of the liquid crystal display panel facing away from the backlight module.

The display device provided by the embodiment of the present application is a liquid crystal display device. Since the anti-peeping module can realize selecting on polarized light, the anti-peeping module can be used as a lower polarizer when the anti-peeping module is located between the display panel and the backlight module, and can be used as an upper polarizer when the anti-peeping module is located on the side of the display panel facing away from the backlight module. Therefore, the liquid crystal display device provided by the embodiment of the present application can save an upper polarizer or a lower polarizer.

When the anti-peeping module is located between the display panel and the backlight module, the display device can avoid influence of the anti-peep module on transmittance of the display panel, and can ensure displaying effect of the display device while realizing 360-degree anti-peeping (anti-spy) and saving polarizer.

Figure 10:
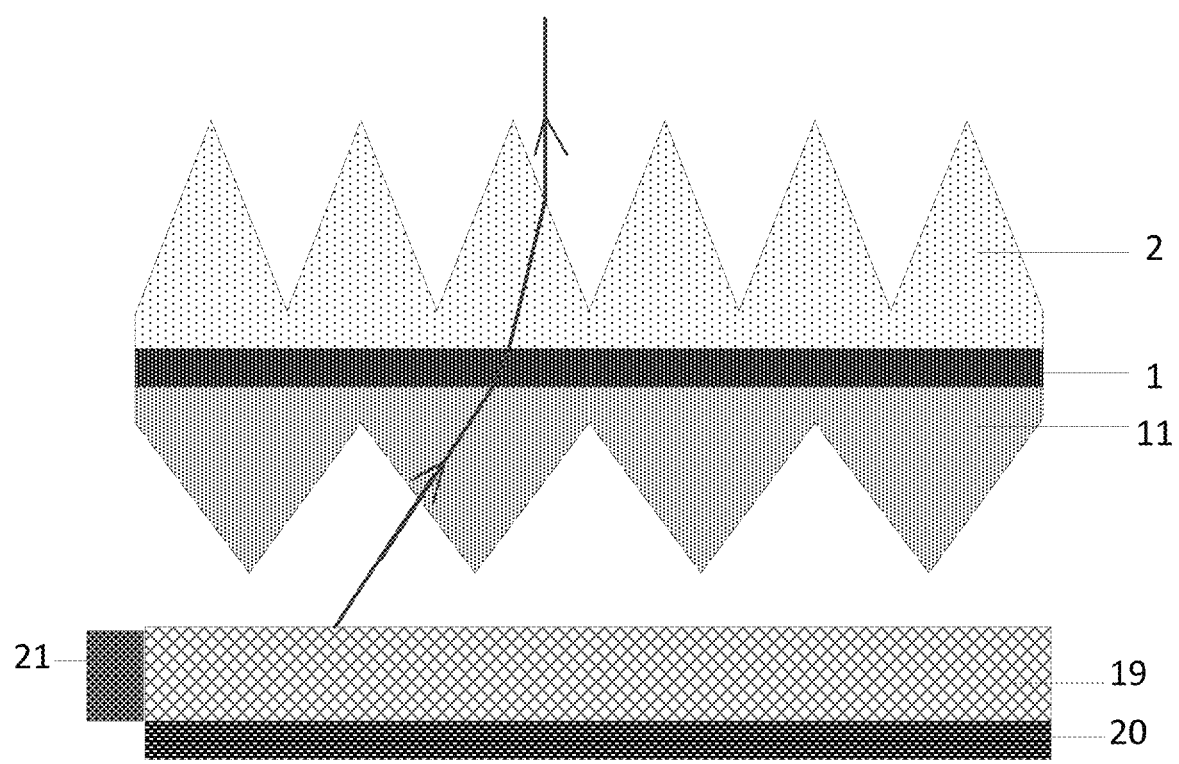
FIG. 10 is a schematic structural view illustrating a display device provided by an embodiment of the present application.

Optionally, as shown in FIG. 10, a backlight module includes a light guide plate 19, a light source 20 on a side surface of the light guide plate, and a reflective sheet 21 on one side of the light guide plate 19 away from a liquid crystal display panel (not shown), and the light guide plate 19 has a dot structure (not shown), which makes light exit angle of the light guide plate to be the highest light output at the Brewster angle, on one side thereof facing away from the reflective sheet. That is, the light source in the backlight module is a side-edged light source.

Figure 11:
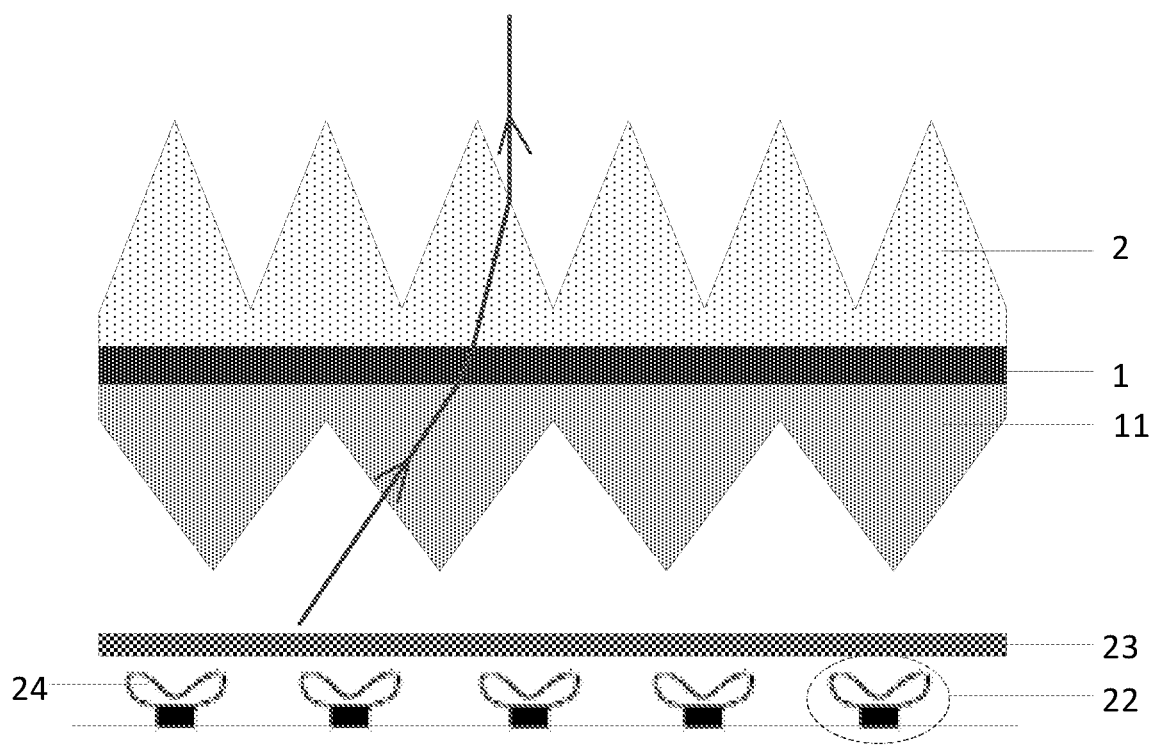
FIG. 11 is a schematic structural view illustrating another display device provided by an embodiment of the present application.

Optionally, as shown in FIG. 11, a backlight module includes bat wing light sources 22 and an optical film 23 located above the bat wing light sources 22, and each of the bat wing light sources 22 include bat wings 24 having an angle to make a light exit angle of light to be the strongest light intensity at Brewster angle. That is, the light sources in the backlight module are a direct-type light source. The optical film may be, for example, a diffusion film or a quantum optical film (QDEF). Since the optical film is provided on the backlight module, the uniformity of light output may be improved.

It should be noted that the specific setting method of the dot structure and the angles of the bat wings may be designed according to the specific values of the Brewster angles of the light transmitting films in the anti-peeping module.

A display device includes an electroluminescence display panel, and the above-mentioned anti-peeping module according to the embodiment of the application, provided on a light exiting side of the electroluminescence display panel.

In summary, in the anti-peeping module and the display device provided by the embodiments of the present application, because the anti-peeping module includes the plurality of light transmitting films, when the incident angle of light in the plurality of light transmitting films is within an angle range including the Brewster angle, the s-polarized light can be totally reflected, so that only the p-polarized light is transmitted, and thus the anti-peeping module provided by the embodiment of the present application can select incident angles within the angle range including the Brewster angle so as to achieve anti-peeping, and meanwhile, the anti-peeping module provided by the embodiment of the present disclosure can achieve 360-degree anti-peeping by selecting angles of light in various directions. Because of the disposing of the first optical path modulating layer, a light exit angle of the anti-peeping module can be adjusted such that the light finally exiting from the anti-peeping module travels in a direction perpendicular to a plane where the anti-peeping module is located, which is convenient for a user to use a display product disposed with the anti-peep module from the front.

Obviously, those skilled in the art can make various modifications and variations to the application without departing from the spirit and scope of the application. As such, if these modifications and variations of the present application fall within the scope of the claims of the present application and their equivalent technologies, the present application is also intended to include these modifications and variations.

What is claimed is:

1. An anti-peeping module, comprising:
   a light transmitting layer, comprising a plurality of light transmitting films, each of the plurality of light transmitting films comprising at least two light transmitting sub-films having different refractive indexes which are disposed in a laminated manner; and
   a first optical path modulating layer, provided on one side of the light transmitting layer, wherein the first optical path modulating layer comprises a zigzag structure, and the first optical path modulating layer is configured to allow light entering into the light transmitting layer at a Brewster incident angle to exit from the anti-peeping module in a travelling direction perpendicular to a plane where the anti-peeping module is located.

2. The anti-peeping module according to claim 1, wherein the light transmitting layer has a light incident surface and a light exit surface both being planes, the zigzag structure of the first optical path modulating layer has a zigzag surface and a plane opposite to the zigzag surface and adjacent to the light transmitting layer, and the first optical path modulating layer is located at a side of the light exit surface of the light transmitting layer.

3. The anti-peeping module according to claim 2, further comprising a second optical path modulating layer at the side of the light incident surface of the light transmitting layer, the second optical path modulating layer comprising a zigzag structure, and the zigzag structure of the second optical path modulating layer has a zigzag surface and a plane opposite to the zigzag surface and adjacent to the light transmitting layer.

4. The anti-peeping module according to claim 1, wherein the light transmitting layer has a light incident surface and a light exit surface both being zigzag surfaces, the zigzag structure of the first optical modulating layer has a zigzag surface and a plane opposite to the zigzag surface and adjacent to the zigzag surfaces of the light transmitting layer, and the first optical modulating layer is located at the side of the light exit surface of the light transmitting layer.

5. The anti-peeping module according to claim 4, further comprising a second optical path modulating layer at the side of the light exit surface of the light transmitting layer, the second optical path modulating layer having a light incident surface and a light exit surface both being zigzag surfaces, and having a refractive index less that of respective one of the light transmitting sub-films adjacent thereto.

6. The anti-peeping module according to claim 1, wherein any adjacent light transmitting sub-films in the plurality of light transmitting film comprise interfaces having Brewster angle equal to one another.

7. The anti-peeping module according to claim 1, wherein the at least two light transmitting sub-films in different ones of the plurality of light transmitting films are made from a same combination of material.

8. The anti-peeping module according to claim 7, wherein the light transmitting sub-films comprising the same materials in any one of the light transmitting films have the same thickness, and respective light transmitting sub-films comprising the same materials in different ones of the light transmitting films have different thicknesses.

9. A display device, comprising: a display panel and an anti-peeping module provided at a display side of the display panel, wherein the anti-peeping module comprises:
   a light transmitting layer, comprising a plurality of light transmitting films, each of the plurality of light transmitting films comprising at least two light transmitting sub-films having different refractive indexes which are disposed in a laminated manner; and
   a first optical path modulating layer, provided on one side of the light transmitting layer, wherein the first optical path modulating layer comprises a zigzag structure, and the first optical path modulating layer is configured to allow light entering into the light transmitting layer at a Brewster incident angle to exit from the anti-peeping module in a travelling direction perpendicular to a plane where the anti-peeping module is located.

10. The display device according to claim 9, further comprising a backlight module, wherein the display panel comprises a liquid crystal display panel; and
   the anti-peeping module is located between the liquid crystal display panel and the backlight module, or is located on one side of the liquid crystal display panel facing away from the backlight module.

11. The display device according to claim 10, wherein the backlight module comprises a light guide plate, a light source on a side surface of the light guide plate, and a reflective sheet on one side of the light guide plate away from the liquid crystal display panel, and wherein the light guide plate has a dot structure which makes light exit angle of the light guide plate to be the highest light output at the Brewster angle, on one side thereof facing away from the reflective sheet; or
   the backlight module comprises bat wing light sources and an optical film located above the bat wing light sources, and each of the bat wing light sources comprise bat wings having an angle to make a light exit angle of light to be the strongest light intensity at Brewster angle.

12. The display device according to claim 9, wherein the display panel comprises an electroluminescence display panel; and the anti-peeping module is provided on a light exiting side of the electroluminescence display panel.

13. The display device according to claim 9, wherein the light transmitting layer has a light incident surface and a light exit surface both being planes, the zigzag structure of the first optical path modulating layer has a zigzag surface and a plane opposite to the zigzag surface and adjacent to the light transmitting layer, and the first optical path modulating layer is located at a side of the light exit surface of the light transmitting layer.

14. The display device according to claim 13, wherein the anti-peeping module further comprises a second optical path modulating layer at the side of the light incident surface of the light transmitting layer, the second optical path modulating layer comprising a zigzag structure, and the zigzag structure of the second optical path modulating layer has a zigzag surface and a plane opposite to the zigzag surface and adjacent to the light transmitting layer.

15. The display device according to claim 9, wherein the light transmitting layer has a light incident surface and a light exit surface both being zigzag surfaces, the zigzag structure of the first optical modulating layer has a zigzag surface and a plane opposite to the zigzag surface and adjacent to the zigzag surfaces of the light transmitting layer, and the first optical modulating layer is located at the side of the light exit surface of the light transmitting layer.

16. The display device according to claim 15, wherein the anti-peeping module further comprises a second optical path modulating layer at the side of the light exit surface of the light transmitting layer, the second optical path modulating layer having a light incident surface and a light exit surface both being zigzag surfaces, and having a refractive index less that of respective one of the light transmitting sub-films adjacent thereto.

17. The display device according to claim 9, wherein any adjacent light transmitting sub-films in the plurality of light transmitting film comprise interfaces having Brewster angle equal to one another.

18. The display device according to claim 9, wherein the at least two light transmitting sub-films in different ones of the plurality of light transmitting films are made from a same combination of material.

19. The display device according to claim 18, wherein the light transmitting sub-films comprising the same materials in any one of the light transmitting films have the same thickness, and respective light transmitting sub-films comprising the same materials in different ones of the light transmitting films have different thicknesses.

* * * * *